United States Patent [19]

Baker et al.

[11] 4,310,583

[45] Jan. 12, 1982

[54] MANUFACTURE OF A GROUP OF INFRA-RED DETECTOR ELEMENTS, AND A GROUP SO MANUFACTURED

[75] Inventors: Ian M. Baker, Southampton; Richard B. Withers, Romsey, both of England

[73] Assignee: U.S. Philips Corporation, New York, N.Y.

[21] Appl. No.: 59,830

[22] Filed: Jul. 23, 1979

[30] Foreign Application Priority Data

Jul. 31, 1978 [GB] United Kingdom ............... 31751/78

[51] Int. Cl.$^3$ .............................................. B32B 3/00
[52] U.S. Cl. ................................... 428/209; 156/630; 156/632; 156/633; 156/655; 204/192 E; 428/332; 428/689
[58] Field of Search ............... 427/75, 76; 204/192 E; 428/209, 332, 689; 156/630, 632, 633, 655

[56] References Cited

U.S. PATENT DOCUMENTS 4,128,467   5/1978   Fischer ........................... 204/192 E Primary Examiner—Bernard D. Pianalto
Attorney, Agent, or Firm—Jack E. Haken

[57] ABSTRACT

A group of infra-red radiation detector elements are manufactured from a body (21) of infra-red sensitive materials on an insulating substrate (22) using two masking steps which do not require critical alignment even with close spacing between the elements. A first masking layer (24; see FIG. 10) e.g. of photoresist is formed on the upper surface of at least the body (21) to determine by a lift-off technique a metallization pattern (35, 36; see FIG. 13) on the body (21) and the substrate (22). A second masking layer (44) e.g. of photoresist is then provided to determine by ion-bombardment through windows (45) of this layer (44) the desired pattern of elements and their electrodes. The ion-bombardment permits removal of exposed areas of not just the body (21) and metallization pattern (35, 36) but also of a passivating layer on the body surfaces; a closely spaced group of elements and their electrodes can be obtained because the ion-bombardment results in steep sides without significant undercutting.

19 Claims, 23 Drawing Figures

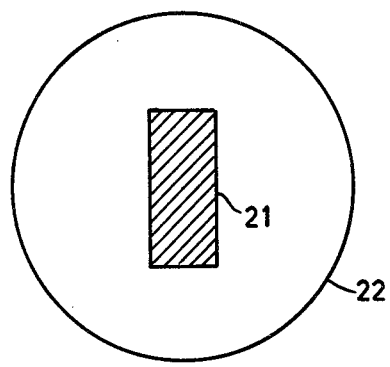
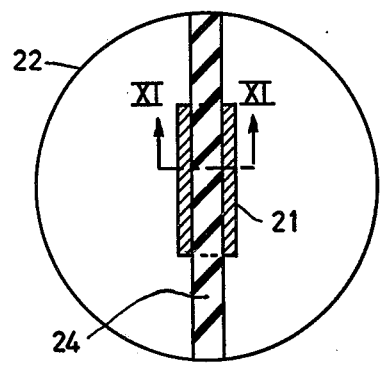
FIG. 9  FIG. 10
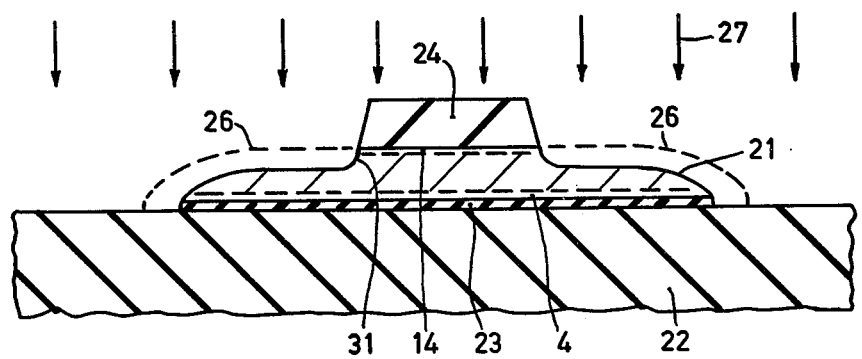
FIG. 11
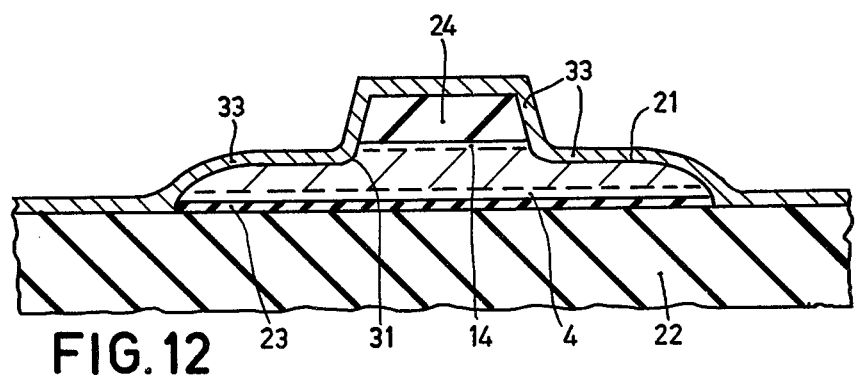
FIG. 12

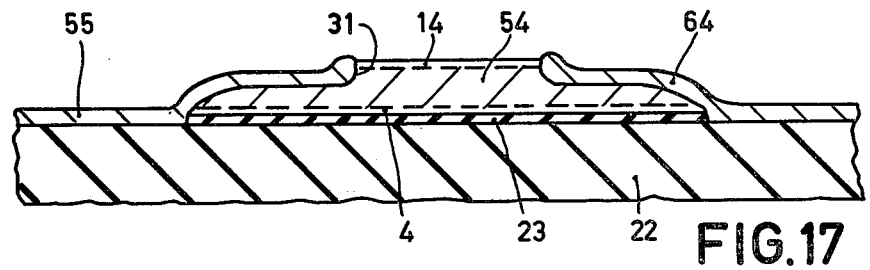
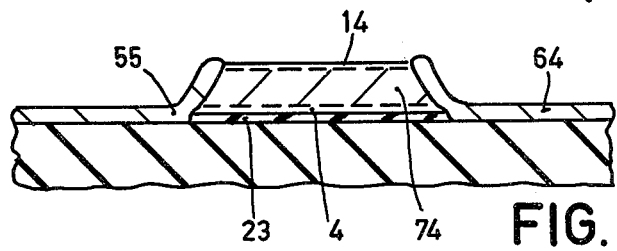
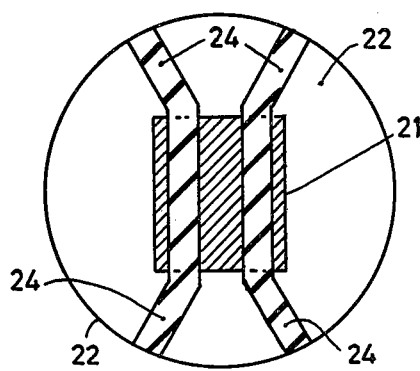
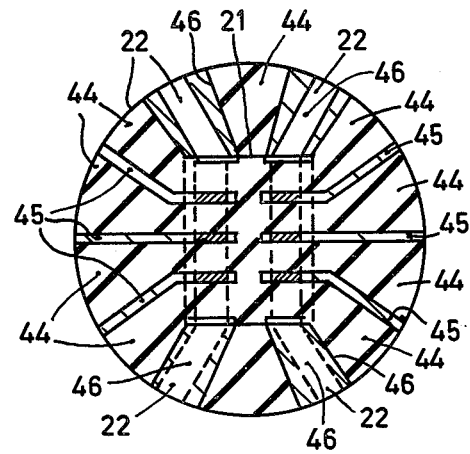
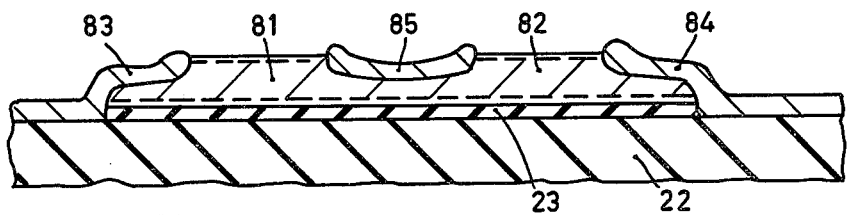

MANUFACTURE OF A GROUP OF INFRA-RED DETECTOR ELEMENTS, AND A GROUP SO MANUFACTURED

The invention relates to methods of manufacturing on an insulating substrate a group of infra-red detector elements, particularly but not exclusively of cadmium mercury telluride, and further relates to groups of infra-red detector elements so manufactured. The groups may be for example linear arrays, 2-dimensional area arrays or staggered arrays, and may be used for, for example, thermal image sensing. U.S. Pat. No. 3,977,018 discloses a method of manufacturing an array of infra-red detector elements on an insulating substrate, including the steps of:

(a) securing a body of infra-red sensitive material to a surface of the substrate, (b) forming on a part of the upper surface of said body a first masking layer for determining the desired array pattern of elements, (c) etching to remove parts of said body from the substrate while using the first masking layer as an etchant mask so as to divide said body into the element array, (d) forming on part of the array surface a second masking layer for determining an electrode pattern for the elements, (e) depositing metal on said second masking layer and on parts of the array surface not masked by said second masking layer, and (f) removing the second masking layer to lift away the excess metal thereon and leave on said body the metal electrodes of the elements.

In this known method the element array pattern is determined wholly by one masking layer, and the electrode pattern is determined wholly by the other masking layer. The masking layer determining the electrode pattern must ensure that individual electrodes of the element are not short-circuited together but are separated by a reasonably wide gap. However preferably these individual electrodes should each cover as much as possible of the length of the respective contactable area of the element. Therefore accurate registration of the two masking layer patterns is desired so that the gap between adjacent individual electrodes is aligned as much as possible with the spacing between the adjacent elements of the array. In the known method the body with the first masking layer is sprayed with a bromine methanol etchant solution to divide the body into the desired element array; this spray etching treatment also first etches away unmasked parts of an anodic oxide layer present at the body surface below the masking layer. This chemical etchant solution etches the body laterally as well as vertically, so that the spacing obtained in this way between the resulting elements of the array is much larger than both the thickness of the body and the width of the masking layer window which exposes the body for etching. Thus, when the body thickness is for example 10 microns the resulting spacing between adjacent elements defined in this way may be for example 20 microns. Because of this large spacing between the elements, its registration with the masking layer determining the electrode pattern is not so very critical.

However it is often desirable to reduce the spacing between adjacent detector elements of an array because this spacing constitutes a non-sensitive area in the array. Reducing this spacing is problematic with chemical etchant solutions. It will additionally make registration of these two masking layers more critical so that it is more difficult to ensure that the element area actually contacted by the electrode is as large as possible.

In addition, the Applicants have found that chemical etchant solutions can also significantly laterally etch passivating layers (such as anodic oxide layers) which are generally provided for the elements; thus, such a passivating layer on the upper surface of the body is etched laterally under the edge of the etchant masking layer, and this can result in part of the sensitive area adjacent the electrode extremities being unpassivated; when such a passivating layer on the lower surface of the body is etched laterally under the lower edge of the resulting detector elements, a weakening of the connection of the elements to the substrate may occur, particularly in the fabrication of a closely-packed array of small-area detector elements.

Furthermore, external connections to the elements of a detector array fabricated by such a known method are often made by bonding wires to large areas of the electrodes overlying part of the infra-red sensitive material of the elements. These electrode areas are also non-sensitive areas of the array, and the bonding of external connections to them on the infra-red sensitive material can result in damage of the material which degrades the detector performance.

According to the present invention a method of manufacturing a group of infra-red detector elements on an insulating substrate, includes the steps of:

(a) securing a body of infra-red sensitive material to an area of a surface of the substrate, (b) forming on a part of the upper surface of said body a first masking layer for determining a metallization pattern, (c) depositing metal on said first masking layer, on parts of said body not masked by said first masking layer, and on the area of said surface of the substrate around said body, (d) removing the said first masking layer to lift away the metal thereon and leave a metallization pattern on the body and substrate, (e) forming on part of said metallization pattern and on part of said body where not covered by said metallization pattern a second masking layer for determining the desired pattern of elements and their electrodes, and (f) using ion-etching to remove parts of said body and of said metallization pattern from the substrate while using said second masking layer as an etchant mask so as to divide said body into the elements of the group and to divide the metallization pattern into metal electrodes of the elements.

In methods in accordance with the present invention the body is divided into the elements of the desired group by ion-etching which permits the elements to be formed which steep side-walls and at most only small lateral etching; in this manner the elements can readily be formed as a closely-packed array on the substrate. The spacing thus achieved between adjacent elements may be for example less than the thickness of said body, and spacings of for example 10 microns and less can be obtained. Both the desired pattern of elements and their electrodes are determined by the second masking pattern; thus, in spite of the small spacing the problem of aligning the first and second masking layers is much less critical, and the same ion-etching as is used to divide said body also divides the metallization pattern into the metal electrodes so that the pattern of the second masking layer can determine and automatically align the spacing between adjacent elements and the gap between adjacent electrodes. By providing the metallization pattern on both the body and the substrate, the metallization pattern when subsequently divided into the electrodes can provide large contact pads which are directly on the substrate and to which external connections to the elements can be made without damaging the infra-sensitive material of the elements.

Ion-etching is a known process by which a surface is eroded by bombardment with high energy particles obtained by accelerating ionised atoms or molecules, at least some of which may be neutralized with electrons before reaching the surface. Ion energies of a few hundred to several thousand eV are generally used.

The Applicants have found that by using such energies, unmasked parts of bodies of infra-red sensitive material such as, for example, cadmium mercury telluride can be readily etched in a reproducible manner throughout their thickness while the effect on the resulting body surface need not significantly increase the low frequency (1/f) noise or reduce the detectivity (D*). The Applicants have also found that ion-etching can be used to locally remove passivating layers (such as anodic oxide layers) both at the upper and lower surfaces of the body without the occurrence of significant lateral etching of the layers.

The first masking layer which determines the metallization pattern left on the body and substrate can define one dimension of the infra-red sensitive active detector area which extends between the electrodes of each detector element; the transverse dimension of the sensitive area can then be defined by the division of the body into elements as determined by the second masking layer. The first masking layer need only be provided on the body and the division of the metallization pattern directly on the substrate may be determined wholly by the second masking layer. However preferably the first masking layer extends also onto the substrate to separate parts of the metallization pattern which subsequently formed on the substrate; these separate parts of the metallization pattern can be used as temporary electrodes for testing the electrical characteristics of the body mounted on he substrate before effecting any of the further processing steps to determine the desired pattern of elements with their electrodes.

In order to illustrate the realisation of these and other features in accordance with the invention and their advantages, embodiments of the invention will now be described, by way of example, with reference to the accompanying diagrammatic drawings, in which:

FIG. 9 is a plan view of one such body mounted on a detector substrate in a subsequent step of the manufacture;

FIG. 10 is a plan view of the arrangement of FIG. 9 after providing a first masking layer;

FIG. 11 is a cross-sectional view taken on the line XI—XI of FIG. 10 after forming a mesa at the body surface by ion-beam etching;

FIG. 12 is a cross-sectional view of the arrangement shown in FIG. 11 after a metal deposition step;

FIG. 17 is a cross-sectional view taken on the line XVII—XVII of FIG. 16;

FIG. 19 is a cross-sectional view taken on the line XIX—XIX of FIG. 18;

FIG. 20 is a modification of FIG. 10 and FIG. 21 is a modification of FIG. 14 both showing plan views at different steps in the manufacture in accordance with the invention of an element array illustrated in section of FIG. 22.

Figure 1:
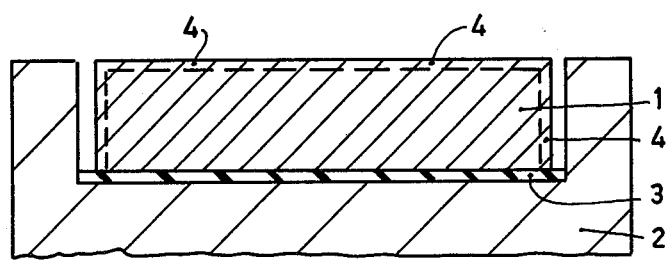
FIG. 1 is a cross-sectional view of a wafer of cadmium mercury telluride mounted on a polishing block at an early stage in the manufacture of an infra-red detector element by a method in accordance with the invention.

It should be noted that the Figures in the accompanying drawings are not drawn to scale; the relative dimensions and proportions of some parts of the Figures have been greatly exaggerated or reduced for the sake of clarity. In particular the thickness of the various layers in relation to their lateral extent is much smaller than may otherwise be apparent from the drawings. The same reference numerals as used in one Figure are generally used to refer to the same or similar parts in other Figures and embodiments.

In the method now to be described with reference to Figures 1 to 17, the starting material is a crystal wafer 1 of cadmium mercury telluride, $Cd_{1-x}Hg_x$ Te where $0<x<1$. The material is sensitive to infra-red radiation, and the atomic ratio of cadmium to mercury may be such as to produce a cut-off wavelength for the material of for example approximately 12 microns. The dimensions of the starting wafer are not critical but should be sufficient to provide the large number of detector elements to be manufactured therefrom, for example over a thousand elements; the wafer may be circular with a diameter of for example 10 m.m.; its thickness maybe for example 0.5 m.m.

The wafer 1 is mounted on a polishing block 2, for example by a layer of wax 3. The thickness of the wafer 1 projecting above shoulders of the block 2 is then lapped away and its exposed major surface is polished in known manner. The resulting wafer thickness may now be for example 200 microns. Preferably the final polishing stage involves a chemical etching treatment to remove surface damage. The polished surface and the side of the wafer 1 are now provided with a passivating layer 4, for example by anodic oxidation in known manner. The resulting arrangement is illustrated in FIG. 1.

Figure 2:
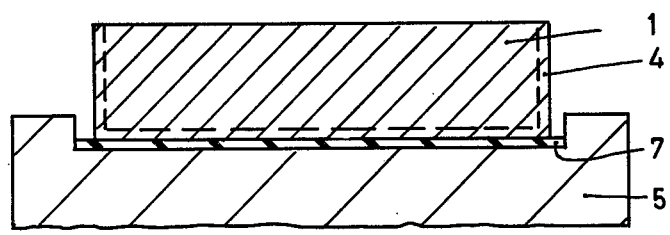
FIG. 2 is a cross-sectional view of the wafer mounted on another polishing block at a subsequent step in the method.
Figure 3:
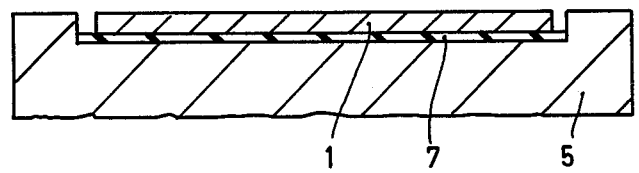
FIG. 3 is a cross-sectional view of the wafer after thinning on said other polishing block.

The wafer 1 is now removed from the block 2 and adhered via its anodized major surface to another polishing block 5, for example with a layer of wax 7. Although the passivating layer 4 is shown in FIGS. 1 and 2, it is omitted in subsequent Figures for the sake of convenience. The thickness of the wafer 1 projecting above shoulders of the block 5 is then lapped away and its exposed major surface is polished in known manner. The resulting wafer thickness may now be for example 15 microns. The resulting arrangement is illustrated in FIG. 3.

Figure 4:
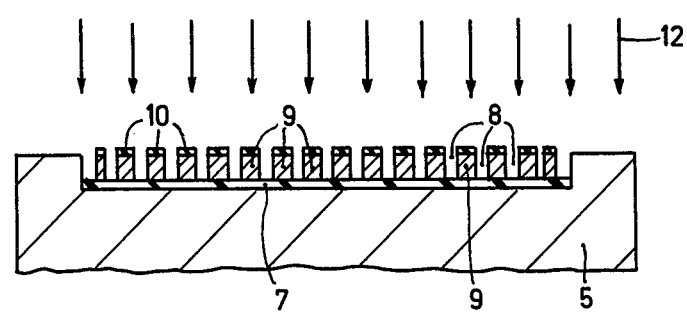
FIG. 4 is a cross-sectional view of the thinned wafer on said other polishing block at a subsequent ion-beam etching step for forming strip portions from the wafer.
Figure 5:
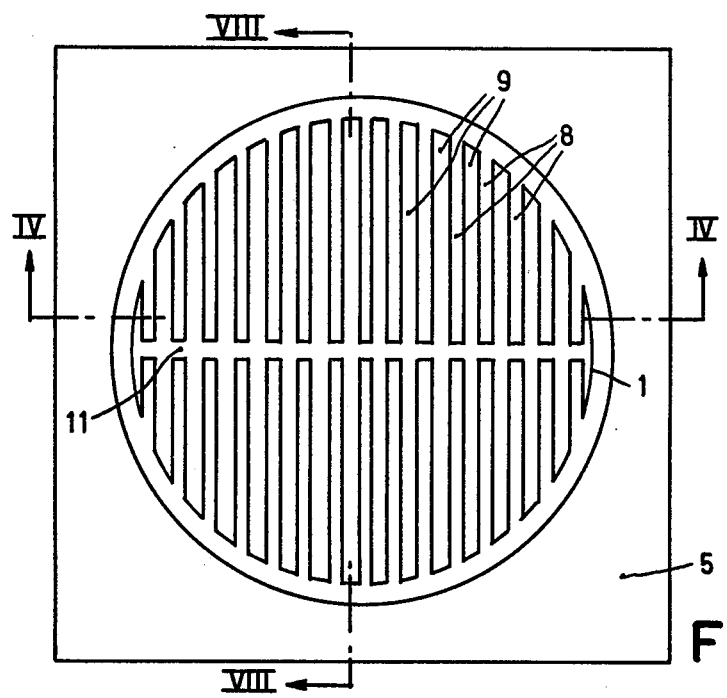
FIG. 5 is a plan view of the thinned wafer on said other polishing block after the ion-beam etching step, the cross-section of FIG. 4 being taken along the line IV—IV of FIG. 5.
Figure 7:
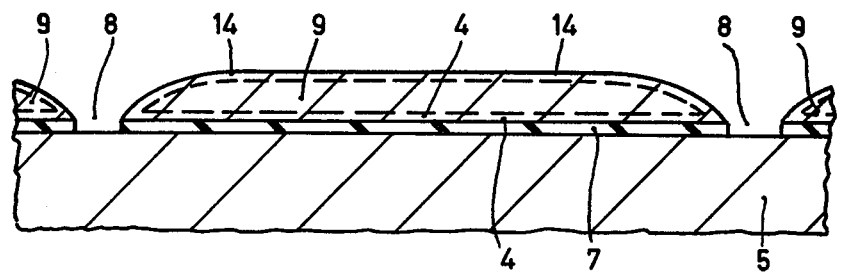
FIG. 7 is a cross-sectional view of parts of three of the strip portions of the wafer after a subsequent anodising treatment.

A layer of photoresist is then provided on the thinned wafer 1 and is selectively exposed and developed to provide a photoresist masking layer 10. The pattern of the layer 10 corresponds to the pattern of interconnected strip portions 9 illustrated in FIG. 5. The photoresist may be for example that commercially available under the trade name Shipley resist AZ 1350H of Shipley Chemicals Limited. An etching treatment is then effected using the layer 10 as an etchmant mask so as to form a plurality of slots 8 through the thickness of the wafer 1. As shown in FIGS. 4 and 5 the slots 8 define substantially parallel strip portions 9 of the wafer which are interconnected by an orthogonal strip 11 extending across a diameter of the wafer.

As illustrated in FIG. 4, this etching treatment may be performed by a beam 12 of, for example argon ions. Such etching is effected in a vaccum chamber with the wafer and block arrangement 1, 5 mounted on a target holder; the target holder may be for example water-cooled and rotatable during the etching treatment. The pressure in the chamber is kept sufficiently low that scattering of the ions is minimal and the surface to be etched is bombarded by the ions at a predetermined angle. The incident ion-beam is obtained from an ion source which may be mounted, for example, at the top of the chamber. The Applicants have used a chamber with a saddle-field ion source commercially available from Iontech Limited of Teddington, U.K. Using this ion source, the etching area at a target distance of 5 cm is found to be 2 sq.cm, and the argon ion current can be up to 45 micro Amps plus an approximately equivalent dose of neutral argon atoms using a voltage of 5kV with a source current of 2mA and an argon pressure of $5 \times 10^{-4}$ torr.

The etch rate depends on the beam current, the incident angle of the beam, the energy of the beam and the nature of the target material. The incident angle can be varied by tilting the target holder. For use at different stages of this method of manufacture, the target holder may be at a distance of, for example, 4 cm. from the ion source with an incident beam which may be perpendicular to the surface or inclined at an angle of up to, for example, 45°; under these conditions the Applicants have etched cadmium mercury telluride at a rate of approximately 4 microns an hour. The etch rate of the Shipley resist was found to be between 0.1 and 0.3 times that of the cadmium mercury telluride. Therefore approximately 4 hours are needed to etch the slots 8 through the 15 microns thickness of the wafer 1. A typical thickness for the layer 10 is 5 to 7.5 microns. By ion-beam etching in this manner, the Applicants have found that steep side walls having a slope of for example 75° can be achieved. In this way narrow slots 8 can be formed in the wafer 1 so that a large proportion of the wafer can be used to provide the detector elements. The remaining strip portions 9 may be for example 200 microns wide, and the slots 8 may be for example 10 microns wide etched through 10 microns wide windows in the masking layer 10. Although FIG. 5 shows only fourteen such strip portions 9 across the diameter of the wafer it should be understood that there are actually many more present.

Figure 6:
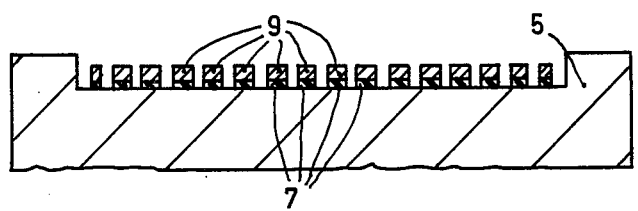
FIG. 6 is a cross-sectional view taken along the same line as FIG. 4 after a thinning and rounding step.

In the next stage of manufacture the part of the photoresist layer 10 remaining on the strip portions 9 is removed after which the thickness of the strip portions 9 is reduced to for example 10 microns while rounding their exposed longitudinal upper edges. This thickness reduction and rounding may be effected by polishing and etching in a manner such as that described in U.S. Pat. No. 4,037,311. FIG. 6 shows in cross-section the strip portions 9 after the etching process; due to the distortion of the relative dimensions of the drawing the rounding of the longitudinal edges is not apparent in this Figure, but it is illustrated in the close-up view of FIG. 7. It should also be noted that the wax layer parts exposed by the slots 8 are removed during the etching of the slots 8 and during the subsequent thinning and rounding treatment.

The exposed upper surface of the strip portions 9 and their side walls are now provided with a passivating layer 14, for example by anodically oxidizing the cadmium mercury telluride surface in known manner. The strip portion 11 serves to interconnect the strip portions 9 during such an anodizing treatment. Both the passivating layers 4 and 14 are illustrated in the close-up cross-sectional view of one such strip portion 9 shown in FIG. 7.

Figure 8:
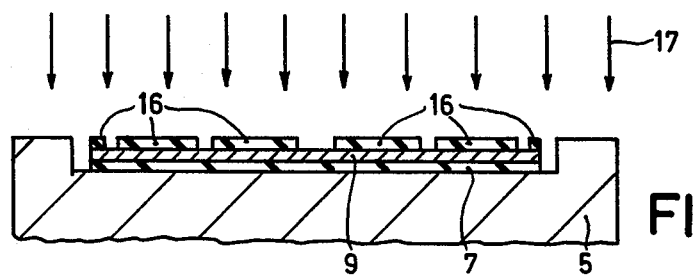
FIG. 8 is a cross-sectional view along the line VIII—VIII of FIG. 5 illustrating the division of a strip portion of the wafer into separate bodies during a further ion-beam etching step.

A further layer of photoresist is then provided and is selectively exposed and developed to form a masking layer 16 having a pattern for dividing the strip portions 9 along their length into a plurality of separate bodies 21 of infra-red sensitive material. This is effected by etching through the thickness of the portions 9 so as to form slots which extend perpendicular to the slots 8. This etching step also may be effected in a manner similar to that described with reference to FIG. 4 by using a beam 17 of argon ions. This step is illustrated in FIG. 8. The length of each body 21 formed from the strip portions 9 in this embodiment is sufficient to provide a linear array of four detector elements as will now be described with reference to FIGS. 9 to 17. The bodies 21 may thus have for example a length of 250 microns, a width of 200 microns and a thickness of 10 microns.

A body 21 is removed from the polishing block 5 and is mounted on an area of a surface of an insulating substrate 22. The surface of the body 21 passivated by the layer 4 is secured to the surface of the substrate 22, for example by a thin adhesive layer 23 which is illustrated in the cross-sectional views of FIGS. 11, 12 and 15. The substrate 22 may be of optically-polished sapphire. The body 21 is shaded in FIG. 9 for the sake of clarity.

Next a layer of photoresist is provided over the surface of the substrate 22 and body 21, and is selectively exposed and developed to form a first photoresist masking layer 24 on a part of the upper surface of both the body 21 and the substrate 22. The layer 24 consists of a stripe of photoresist which is shown shaded in FIG. 10. The stripe 24 extends locally across the body 21 in a direction substantially perpendicular to those along which the body 21 will subsequently be divided into the desired linear array. The stripe 24 is present on the passivating layer 14 on the body surface where the underlying masked area defines the passivated active area of the detector element; in this active area which may be for example 50 microns wide the infra-red radiation is to be sensed. The areas not masked by the stripe 24 are subsequently provided with a metallization pattern as will be described hereinafter. The stripe 24 determines a separation in the metallization pattern on the body 21 and extends onto the substrate 22 to also separate parts of the metallization pattern where subsequently formed on the substrate 22.

Before depositing metal for said metallization pattern a mesa is formed at the body surface by ion-beam etching. This is illustrated in FIG. 11. While using the stripe 24 as an etchant mask the exposed part of the passivating layer 14 and an underlying portion of the infra-red sensitive material is removed by bombardment with a beam 27 of for example argon ions. The etching conditions may be similar to those described previously in connection with FIGS. 4 and 8. However the bombardment is effected for a shorter time so that the etching occurs through only part of the thickness of the body 21. As a result there is formed a mesa 31 upstanding on the remainder of the body 21; this mesa 31 of infra-red sensitive material is topped by the remainder of the masking stripe 24, and the remainder of the passivating layer 14 is present between the top of the mesa 31 and the stripe 24. The broken line 26 in FIG. 11 indicates the original passivated surface of the body 21. The ion bombardment also etches to a lesser extent the photoresist stripe 24 and the exposed surface of the substrate 22, but this is not indicated in the drawing for the sake of simplicity.

The Applicants have found that the etch rate of anodic oxide which forms the layer 14 is approximately 1.3 times that of the underlying cadmium mercury telluride, and that there does not occur any significant removal of the layer 14 under the edge of the masking layer 24 during the ion-beam etching; this is important since it is desirable for the layer 14 to adjoin at its edges the subsequently provided metal electrodes. Similarly no significant etching occurs of the layer 4 under the edge of the body 21.

The Applicants have found that ion-beam etching permits the mesa 31 to be formed in a reproducible manner with a well-defined shape by uniform removal of cadmium mercury telluride from the unmasked surface parts of the body 21. The cadmium mercury telluride is etched to a uniform depth of at least 0.5 micron and preferably much deeper for example 2 or 3 microns; the resulting structure permits a significant proportion of the current occurring between the detector electrodes in operation of the final detector element to flow across the bulk of the mesa 31 between its side-walls rather than adjacent its top surface. The ion-beam etching permits the side-walls of the mesa 31 to be comparatively steep, for example with a slope of 75°. The factors that control the slope include the angle of the beam 27, the shape and etching of the resist 24 and any redeposition of the ejected target atoms.

After forming the mesa 31, metal is deposited to form a layer 33 on the photoresist stripe 24, on parts of the body 21 not masked by the stripe 24, and on the area of the surface of the substrate 22 around the body 21. This metal layer 33 is thus deposited on both the side-walls of the mesa 31 and on the surface of the remainder of the body 21. The resulting structure is illustrated in FIG. 12.

Preferably the metal is deposited by evaporation because chromium is difficult to sputter, and evaporation is a relatively cool, low energy process which does not significantly damage the cadmium mercury telluride. The Applicants have found that even evaporated metal can have good adhesion to the topographically rough surfaces produced by the ion-beam etching on both the cadmium mercury telluride body 21 and the sapphire substrate 22. However it is of course possible to deposit the metal in other ways, for example by sputtering. The Applicants have found it is advantageous for the metal to consist of a first layer of chromium deposited in contact with the infra-red sensitive material (because of the strong adhesion of chromium to both cadmium mercury telluride and sapphire) and a thicker second layer of gold deposited on the chromium layer to reduce the electrical resistance of the metal film; chromium has both a thermal expansion coefficient and a work function compatible to that of cadmium mercury telluride and does not form an amalgam with either mercury or gold at temperatures below approximately 150° C. Such an evaporated gold-chromium layer 33 can have a particularly strong adhesion to both the body 21 and the substrate 22. The chromium may be for example 0.05 micron thick, and the gold may be for example 0.5 micron thick.

Figure 13:
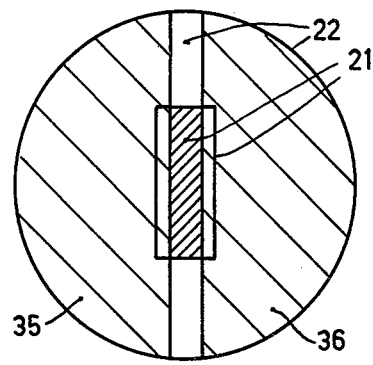
FIG. 13 is a plan view of the arrangement of FIG. 12 after removal of the first masking layer.

The masking layer 24 is then removed to lift away the metal thereon and to leave the remainder of the layer 33 as a metallization pattern 35, 36 on both the body 21 and the substrate 22, as illustrated in FIG. 13. Since the layer 24 is of photoresist it can be removed by immersing in acetone and possibly using agitation to aid the removal in known manner. The remaining metallization pattern consists of two separate parts 35 and 36 each of which extends on the side-walls of the mesa 31 and will be further processed subsequently to form separate detector electrodes contacting these side-walls of the detector elements.

This further processing involves masking and etching the body 21 and the metallization pattern 35, 36 to divide them into a desired pattern of detector elements and their electrodes. For this purpose a second masking layer 44 is provided on most of the metallization pattern 35, 36 and most of the body 21 where not covered by the pattern 35, 36. This layer 44 may also be formed of photoresist such as for example Shipley resist AZ 1350H and has a plurality of windows 45 and 46 which are formed by selective exposure and development of the photoresist.

Figure 14:
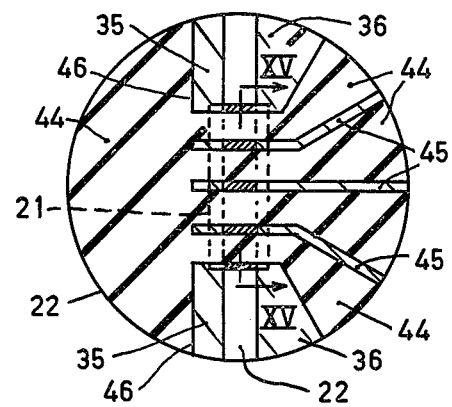
FIG. 14 is a plan view of the arrangement of FIG. 13 after providing a second masking layer for determining the desired pattern of detector elements and their electrodes.

As shown in FIG. 14, the stripe-shaped windows 45 extend substantially parallel to each other across the upper surface of the body 21 and then diverge away from each other across the metallization pattern 35, 36 on the substrate 22. The layer 44 also has larger windows 46 at the opposite ends of the body 21 to define the opposite ends of the array. In this way a closely-packed linear array of small detector elements can be formed with large contact pads on the substrate 22 for external connections. The windows 45 extend across the body 21 in a direction substantially perpendicular to that along which the earlier stripe 24 extended; such transverse stripe features in the two masks 24 and 44 provide a comparatively easy way of defining a linear element array in a reproducible manner. The windows 45 and 46 expose parts of the body 21 and of the metallization pattern 35, 36 which are now to be removed from the substrate 22 by ion-beam etching.

This etching may be effected using a beam 47 of argon ions in a manner similar to that described hereinbefore with reference to FIG. 8. The etching is effected throughout the thickness of the body 21 and throughout the thickness of the layer pattern 35, 36 while using the layer 44 as an etchant mask. The width of the stripe-shaped windows 45 may be for example 12.5 microns, and the width of the masked area of the body 21 between adjacent windows 45 may be 50 microns. The steep side-walls produced by ion-beam etching of the cadmium mercury telluride and the only very small underetching which occurs permit the fabrication of a very closely packed array of detector elements from the monolithic body 21; this is a considerable advantage over the use of chemical solutions as etchants. Thus, the spacing between adjacent elements of the array formed in this way may be very small, for example 10 microns.

The argon ions also etch away the exposed metallization in the same etching step. The etching is continued for a sufficiently long time to etch through not only the exposed parts of the body 21, but also through the parts of the body 21 where covered by the exposed parts of the metallization pattern 35, 36. The ion-beam etching also removes the exposed parts of the passivating layer 4 and 14 between the elements of the array without significant lateral etching under the edges of either the masking layer 44 or the resulting elements.

Figure 16:
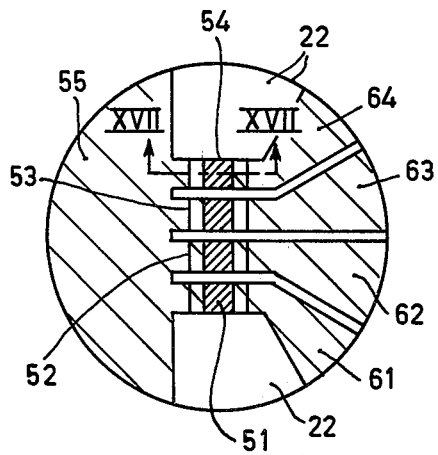
FIG. 16 is a plan-view of the resulting detector element array which is in accordance with the invention.

After removing the second masking layer 44, the resulting detector arrangement is as shown in FIGS. 16 and 17. The group of four detector elements 51, 52, 53 and 54 so formed are arranged as a linear array having on one side a common electrode 55 formed from the metallization pattern part 35 and on the opposite side individual electrodes 61, 62, 63, 64 respectively which are formed from the metallization pattern part 36. Each of these detectors comprises a mesa 31 of the infra-red sensitive material with the separate metal electrodes 55 and for example 64 on the opposite side-walls of the mesa 31, as illustrated for detector element 54 in FIG. 17. This mesa contacting of the elements 51 to 54 results during operation, in a reduction of the current density which occurs near the extremities of the electrode and adjacent the top surface of the mesa 31; in spite of the passivating layer 14 covering this surface the charge-carrier recombination velocity is generally higher at this surface than in the bulk so a significant advantage can be obtained with this mesa structure (as compared with electrodes on a flat surface) because a significant proportion of the current can flow across the bulk of the mesa 31 between its side-walls. This can lead to significant performance benefits for the detector element, for example less low-frequency noise. This technique is described and claimed in our PHB 32631 Patent Application which is filed on the same day as the present Application and to which reference is invited. The technique is not essential to the present invention.

As a result of the ion-beam etching of the passivating layer 14 using the metallization mask 24 as an etchant mask, the passivating layer 14 remaining over the top of the mesa 31 of each detector element 51 to 54 is adjoined at the edge by its separate electrodes 55 and for example 64. Thus, as illustrated in FIG. 17 for detector element 54, no unpassivated infra-red sensitive material is exposed at the top surface adjacent the extremity of the electrodes 55 and for example 64. This also enhances the performance of the detector elements 51 to 54.

The fabrication process described with reference to FIGS. 9 to 17 requires only two masking steps. The first mask 24 determines a metallization pattern and its alignment is not critical. The second mask 44 determines the desired pattern of elements and their electrodes which are formed from the body 21 and the metallization pattern respectively. Such a process has an advantage in not requiring a critical alignment of separate masking steps, one for dividing the body 21 into elements and another for defining the electrode pattern, in spite of the very small spacing between adjacent elements of the array.

External connections can be made to the elements of the array by bonding wires to the parts of the electrodes 55, 61, 62, 63 and 64 where they are present directly on the substrate 22.

Figure 18:
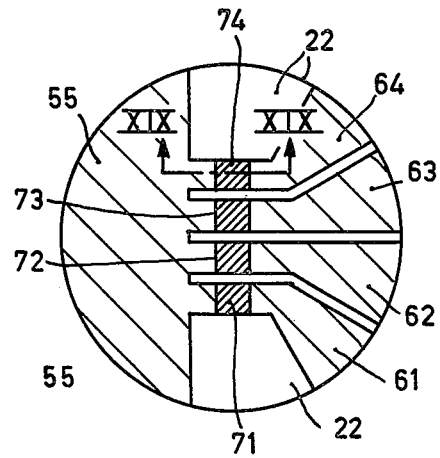
FIG. 18 is a modification of FIG. 16 showing in plan-view a detector element array in accordance with the invention and manufactured by a slightly different method also in accordance with the invention.

Many modifications are possible within the scope of the present invention. FIGS. 18 and 19 illustrate one such modification in the fabrication of which the ion-beam etching step illustrated in FIG. 11 has been continued across the whole thickness of the body 21 to the surface of the substrate 22 to shape the body 21 into an upstanding mesa 31 of cadmium mercury telluride which remains standing on the substrate 22 and is topped by the stripe 24 and part of the passivating layer 14. The processing is then continued as described with reference to FIGS. 12 to 15 to form the detector device of FIGS. 18 and 19 having detector elements 71 to 74. In this modified device the contact between the element body and its electrodes 55 and for example 64 is formed wholly by the metal on the side-walls of the mesa, as illustrated in FIG. 19 for element 74. In such a wholly-mesa element a higher proportions of the current can flow across the bulk of the body. Furthermore in the detector of FIGS. 16 and 17 the metallization pattern 35, 36 may be locally weakened where it extends from the edge of the body 21 to the substrate 22, for example if the adhesive layer 23 does not extend all the way to this edge; in the detector of FIGS. 18 and 19, however, such a deficiency in the adhesive layer may be removed by the ion-beam etching of the mesa 31 down to the substrate surface and this can improve the metallization.

By forming a body 21 of different size and/or by using a different pattern for the first masking layer 25 and/or the second masking layer 44 different groups of detector elements can be formed on the substrate 22. FIGS. 20 to 22 illustrate one example in which the strip portions 9 and hence the bodies 21 formed from the wafer are sufficiently wide to accommodate two back-to-back linear arrays of detector elements which together form a 2-dimensional area array. In this case as shown in FIG. 20, the first masking layer 24 for determining the metallization pattern consists of two photoresist stripes which are parallel to each other along the length of the body 21 and then diverge from each other over the substrate 22. The stripes 22 may each be for example 50 microns wide and may be separated by a distance of for example 100 microns over the body 21. In order to divide the body 21 and metallization pattern into the area array of elements and their electrodes, the second masking layer 44 has a corresponding set of stripe-shaped windows 45 on each side of the body 21, as illustrated in FIG. 21. As shown in FIG. 22, the resulting detector array consists of back-to-back elements such as elements 81 and 82 having individual electrodes such as electrodes 83 and 84 and an intermediate electrode 85 which is common to all the elements and which is defined by the area between the two stripes 24 in FIG. 20. All these elements, e.g. 81 and 82, have a mesa structure which is contacted at its sidewalls by the element electrodes, e.g. 83, 84 and 85.

Instead of forming an array of back-to-back elements as shown in FIG. 22, alternate element areas of each linear array may be removed by the ion-beam etching used to divide the body 21, thereby forming a staggered array of the elements.

Instead of forming such a long body 21 as that illustrated in FIGS. 10 and 20, a shorter body 21 may be used and the second masking layer may comprise only one stripe-shape window 45 so as to form a 2×1 linear array or a 2×2 area array of elements respectively.

Figure 15:
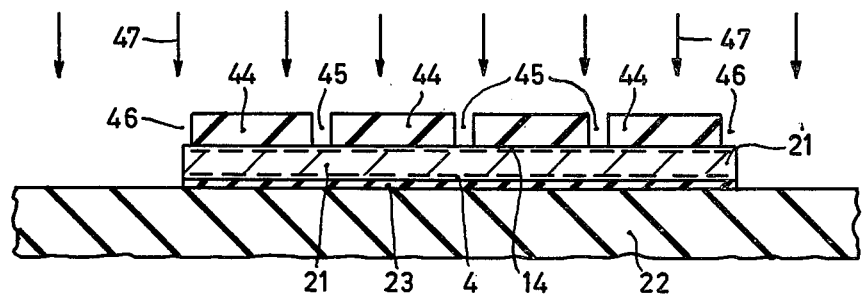
FIG. 15 is a cross-sectional view of the arrangement of FIG. 14 during an ion-beam etching step to form said desired pattern.
Figure 23:
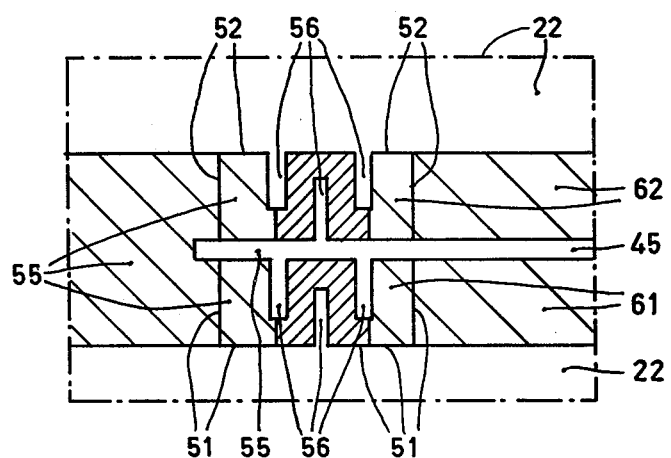
FIG. 23 is a plan view of part of a modified array also manufactured in accordance with the invention.

By appropriately changing the shape of the stripe-shaped windows 45 in the second masking layer 44, part of the infra-red sensitive material between where the electrodes are formed can be removed over the whole thickness of the body 21 and across part of the width of each element by ion-beam etching in the same step as that illustrated in FIG. 15, so as to define a current path between the electrodes which extends through the remaining infra-red sensitive material and is longer than the distance along a straight line between the contact areas. Two such modified elements are illustrated in FIG. 23. This technique is described and claimed in another of our co-pending Patent Applications (PHB 32632) filed on the same day as the present Application and the contents of the Specification of which are hereby incorporated by reference into the present Specification. Thus, the windows 45 where they cross the body 21 may be extended sideways to form a plurality of substantially parallel slots 56 which extend from opposite side walls of the element to form a meandering current path between the electrodes. This longer current path increases the resistance and charge-carrier transit time in the detector element and so can improve the responsivity of the detector.

The ion-beam etching illustrated in FIG. 15 forms exposed unpassivated sides of the detector elements. These sides can be passivated by subsequently forming a passivating layer in known manner, although it appears to the Applicants that the ion-beam etched sides already possess some intrinsic passivation, perhaps as a result of implantation of the inert ions at the surface. Instead of forming a passivating layer 14 on the upper surface of the detector elements before metallization and element definition, the sensitive active areas of the elements and their sides can be passivated by a subsequent treatment.

The Applicants have found that ion-beam etching (especially with at least part of the ion beam neutralized with electrons) has proved to be a particularly reproducible etching process for infra-red sensitive materials such as cadmium mercury telluride, while avoiding serious damage to the material. However instead of ion-beam etching, other equivalent forms of ion-etching may be used, for example so-called "magnetron sputtering" in which the ion flux used for sputter-etching is concentrated by a magnetic field. Magnetron sputtering is described in for example the article entitled "Equipment for sputtering" by A. J. Aronson, Solid State Technology, Dec. 1978, pages 66 to 72, although this article is primarily concerned with sputter-deposition rather than sputter-etching. Other ion-etching processes are described in the articles "An Investigation of Ion-Etching" by H. Dimigen et al, Philips Technical Review, Vol. 35, No. 7/8, pages 199 to 208, and "Introduction to Ion and Pasma Etching" by S. Somekh, Journal Vacuum Science Technology, Vol. 13, No. 5, pages 1003 to 1007.

Instead of forming the detector elements of cadmium mercury telluride, other infra-red sensitive materials may be employed, for example other ternary intermetallic chalcogenides such as for example lead tin telluride or other monocrystalline semiconductors such as for example lead sulphide or indium antimonide.

In the embodiments described hereinbefore the methods comprise the application of ohmic contact electrodes to element bodies having a uniform material composition and for use in detectors of which the operation is based on intrinsic photoconductivity. However also within the scope of the present invention is the manufacture of detector elements each of which has a p-n junction located in the sensitive mesa area of the element body; in this case the element has electrodes which extend on the side-walls of the mesa and make ohmic contact to the p-type and n-type regions respectively of the body.

It will also be evident that other metals than gold and chromium may be used to form the electrodes, for example aluminium or silver, and that the detector substrate may be of material other than sapphire. Thus, for exampled the insulating substrate 22 may be of for example alumina, silicon or beryllia.

It is claimed:

1. A method of manufacturing a group of infra-red detector elements on an insulating substrate, including the steps of:
   (a) securing a first surface of a body of infra-red sensitive material to an area of a surface of the substrate;
   (b) forming a first masking layer of determining a metallization pattern on a second surface of said body, which second surface is opposite said first surface,
   (c) depositing metal on said first masking layer, on parts of said body not masked by said first masking layer, and on an area of said surface of the substrate around said body;
   (d) removing the said first making layer to lift away the metal thereon and leave a metallization pattern on the body and substrate;
   (e) forming a second masking layer for determining a desired pattern of elements and their electrodes on part of said metallization pattern and on part of said body which is not covered by said metallization pattern; and
   (f) using ion-etching to remove parts of said body and parts of said metallization pattern from the substrate while using said second masking layer as an etchant mask so as to divide said body into the elements of the group and to divide the metallization pattern into metal electrodes of the elements.

2. A method as claimed in claim 1, in which the first masking layer is provided after securing said body to the substrate and extends onto the substrate to separate parts of the metallization pattern which are subsequently formed on the substrate.

3. A method as claimed in claim 1, in which the second masking layer comprises at least one stripe-shaped window which extends locally across the second surface of the body and locally across the metallization pattern on the substrate to expose parts of said body and said metallization pattern which are to be removed by the ion-beam etching.

4. A method as claimed in claim 3, in which the second masking layer comprises a plurality of said stripe-shaped windows which extend substantially parallel to each other across the second surface of said body and then diverge away from each other across the substrate.

5. A method as claimed in claim 3, in which the first masking layer comprises at least one stripe of masking material which extends locally across the body in a direction substantially perpendicular to that in which the said stripe-shaped window or windows will extend, which at least one stripe of the first masking layer defines together with said second masking layer at least one linear array of the detector elements on the substrate.

6. A method as claimed in any of claims 1, 2, 3, 4, 5, wherein a passivating layer is formed at least at the second surface of said body before providing said first masking layer; and wherein before depositing said metal, the first masking layer is used as an etchant mask removing said passivating layer from said second surface where it is not masked by said first masking layer.

7. A method as claimed in claim 6, in which the etching treatment used to remove said passivating layer is continued through part of the thickness of said body to form, on the remainder of said body, an upstanding mesa of infra-red sensitive material topped by said first masking layer and part of said passivating layer.

8. A method as claimed in claim 6, in which the etching treatment used to remove said passivating layer is continued through the whole thickness of said body to the surface of said substrate to shape said body into at least one upstanding mesa of infra-red sensitive material topped by said first masking layer and part of said passivating layer.

9. A method as claimed in claim 1, in which a passivating layer is formed at the first surface of said body before securing said body to the substrate, and said ion-etching step (f) of claim 1 is continued to remove from the substrate parts of this passivating layer between the elements of the array.

10. A method as claimed in claim 1, in which said body is divided in the ion-etching step (f) of claim 1 into elements which are spaced apart by at most 10 microns.

11. A method as claimed in claim 1, in which said ion-etching is effected using an ion-beam.

12. A group of infra-red detector elements on an insulating substrate manufactured by a method claimed in claim 1.

13. A method as claimed in claim 2, in which the second masking layer comprises at least one stripe-shaped window which extends locally across the second surface of the body and locally across the metallization pattern on the substrate to expose parts of said body and said metallization pattern which are to be removed the ion-beam etching.

14. A method as claimed in claim 13, in which the second masking layer comprises a plurality of said stripe-shaped windows which extend substantially parallel to each other across the second surface of said body and then diverge away from each other across the substrate.

15. A method as claimed in claim 4, in which the first masking layer comprises at least one stripe of masking material which extends locally across the body in a direction substantially perpendicular to that in which the said stripe-shaped window or windows will extend, which at least one stripe of the first masking layer defines together with said second masking layer at least one linear array of the detector elements on the substrate.

16. A method as claimed in claim 13, in which the first masking layer comprises at least one stripe of masking material which extends locally across the body in a direction substantially perpendicular to that in which the said stripe-shaped window or windows will extend, which at least one stripe of the first masking layer defines together with said second masking layer at least one linear array of the detector elements of the substrate.

17. A method as claimed in claim 14, in which the first masking layer comprises at least one stripe of masking material which extends locally across the body in a direction substantially perpendicular to that in which the said stripe-shaped window or windows will extend, which at least one stripe of the first masking layer defines together with said second masking layer at least one linear array of the detector elements on the substrate.

18. A method as claimed in claim 6, in which a passivating layer is formed at the first surface of said body before securing said body to the substrate, and said ion-etching step (f) of claim 1 is continued to remove from the substrate parts of this passivating layer between the elements of the array.

19. A group of infra-red detector elements on an insulating substrate manufactured by a method claimed in claim 6.

* * * * *

UNITED STATES PATENT AND TRADEMARK OFFICE
CERTIFICATE OF CORRECTION

PATENT NO. : 4,310,583

DATED : January 12, 1982

INVENTOR(S) : IAN M. BAKER ET AL

It is certified that error appears in the above—identified patent and that said Letters Patent is hereby corrected as shown below:

Claim 1 Line 6 change "of" to --for--.

Signed and Sealed this

Twentieth Day of July 1982

[SEAL]

Attest:

GERALD J. MOSSINGHOFF

Attesting Officer

Commissioner of Patents and Trademarks